United States Patent
Banaska et al.

(10) Patent No.: US 7,276,893 B2
(45) Date of Patent: Oct. 2, 2007

(54) AUTOMATIC RANGING CURRENT SHUNT

(75) Inventors: John G. Banaska, Wadsworth, OH (US); Wayne C. Goeke, Hudson, OH (US)

(73) Assignee: Keithley Instruments, Inc., Cleveland, OH (US)

(*) Notice: Subject to any disclaimer, the term of this patent is extended or adjusted under 35 U.S.C. 154(b) by 0 days.

(21) Appl. No.: 11/067,953

(22) Filed: Feb. 28, 2005

(65) Prior Publication Data

US 2006/0192547 A1    Aug. 31, 2006

(51) Int. Cl.
*G01R 1/38* (2006.01)

(52) U.S. Cl. .................................................. 324/115

(58) Field of Classification Search .................... None
See application file for complete search history.

(56) References Cited

U.S. PATENT DOCUMENTS

| 4,395,678 A | * | 7/1983 | Pelta ........................... 324/132 |
| 5,451,881 A | * | 9/1995 | Finger ......................... 324/433 |

* cited by examiner

*Primary Examiner*—Ha Tran Nguyen
*Assistant Examiner*—Trung Q. Nguyen
(74) *Attorney, Agent, or Firm*—Pearne & Gordon LLP

(57) ABSTRACT

A range-changing circuit includes an array of graduated impedances in serial relationship, and a voltage sensing and limiting switch across one of said impedances. The switch limits the voltage across said one of the impedances in response to a voltage sensed by the switch.

7 Claims, 3 Drawing Sheets

AUTOMATIC RANGING CURRENT SHUNT

BACKGROUND OF THE INVENTION

The present invention relates to electrical measurement equipment and, in particular, to a range-changing circuit.

It is common in electrical measurement devices to have range selecting circuits on order to provide the desired range of measurements.

The simplest form is simply to use a selector switch to provide the desired range. More complex automatic range-changing circuit may use relays controlled by the value measured by the measurement device to select a range that puts the measured value within a desirable range. This process becomes more complicated as greater ranges, accuracies and speed are desired. Heretofore, these factors have created the need for more circuitry and complexity to produce the desired levels and performance.

Referring to FIG. 1, an exemplary prior art measurement device 1 is a source measure unit (SMU) in voltage control mode (voltage sourced, current measured). An error amp A1 controls $Q_{OUT}$. A series of current sensing elements and switches (except for the lowest range) are connected in parallel and are in series with the load resistor to provide range-changing. A differential amplifier senses across $R_{LOAD}$ and provides voltage feedback $V_{FB}$. Feedback resistors R compare the $V_{FB}$ to the $V_{DAC}$ and present the corresponding error voltage to A1.

Switches $S_1$ to $S_N$ may be electromechanical relays or solid-state switches with their attendant bootstrapping components to eliminate switch leakage. All the switches are controlled by a microprocessor in response to the voltage measured on a current sensing element selected by the microprocessor. The microprocessor thus choosing the desired range.

The switches are in series with the load; therefore an instantaneous change in $R_{SENSE}$ (by turning on a switch) will present a transient to the output. In the case of solid-state switches a "ramping" circuit is generally used to "fade" in the new element in parallel with the old, allowing the gain bandwidth of the loop to minimize the glitch. Because of the wide dynamic range of resistors, timing the ramps can be problematic and usually results in a tradeoff, where the higher current ranges are switched slower than they need to be, while the lower current ranges may have a larger transient. These glitches and transients are usually present at a time after the output has settled and are in response to measurements made by the A/D converter. If a different range is needed the corresponding process of selecting a range may make a transient that may take 100's of ms to settle at low currents. In many cases, noise may cause "hunting" in which a never-ending series of glitches is present.

SUMMARY OF THE INVENTION

A range-changing circuit includes an array of graduated impedances in serial relationship, and a voltage sensing and limiting switch across one of said impedances. The switch limits the voltage across said one of the impedances in response to a voltage sensed by the switch.

DESCRIPTION OF THE PREFERRED EMBODIMENTS

Figure 2:
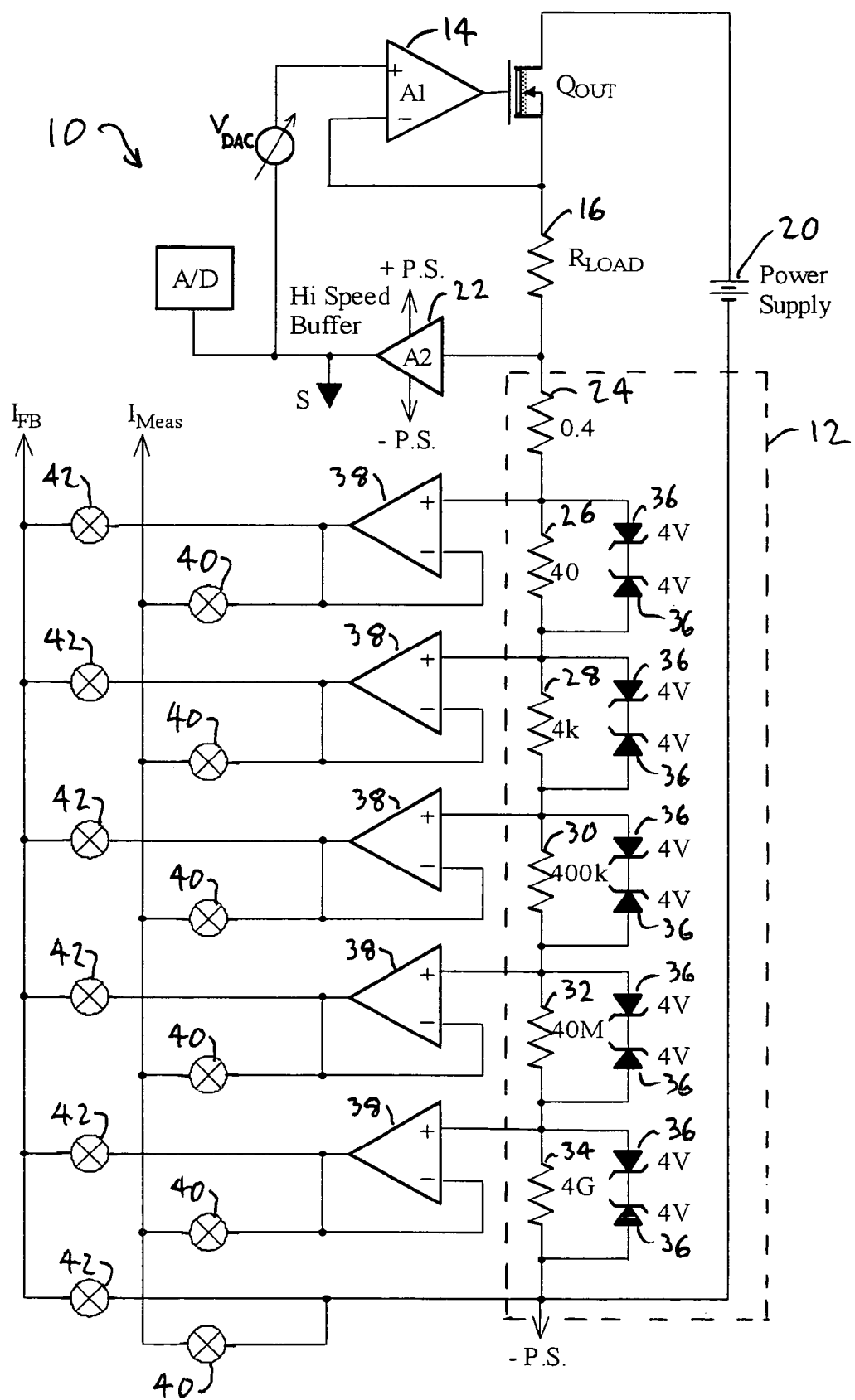
FIG. 2 is a schematic diagram of an exemplary device according to the invention.

Referring to FIG. 2, a measurement device 10 includes a range-changing circuit 12. The amplifier 14 operates to apply the voltage $V_{DAC}$ across the load 16 via the transistor 18, the power supply 20 and the circuit 12. The buffer 22 provides a buffered version of the voltage to the voltage feedback loop.

The circuit 12 includes an array of graduated impedances 24, 26, 28, 30, 32, 34, for example, having impedances as labeled. Across each of the impedances, are back-to-back zener diodes 36 having, for example, a 4 volt zener voltage.

The amplifiers 38 and switches 40, 42 provide sensing pick off points of the voltages developed across the circuit 12. The switches 40 allow sensing of the voltages of the circuit 12 for measurement purposes, while the switches 42 allow feedback to a control circuit when forcing current through the load 16. It should be noted that the series nature of the circuit 12 allows sourcing and measuring be decoupled as the pick off points can be selected independently for the two purposes.

In this example, each of the impedances 24, 26, 28, 30, 32, 34 cover 2 decades of current. For example, if 1 volt is impressed on a load 16 having a value of 10 TΩ then 100 pA of current will flow and 0.4 volts will exist across the impedance 34.

Once the current exceeds 1 nA, the zener diodes across the impedance 34 will clamp and limit the voltage to 4 volts. Now an additional 4 volts may develop across the impedance 32 allowing a load current up to 100 nA. As $V_{DAC}$ is increased, the clamps turn on until a range remains unsaturated. At 100 mA, 20 volts would be present across the array, but only the tap on the impedance 26 would not be saturated. The voltages across the impedances are measured with respect to ground S. In this manner, it can be seen that the circuit 12 is "automatically" switching ranges without any instructions from the actual measurement device.

It should be pointed out the diodes 36 are arranged in back-to-back manner to allow bipolar measurements, otherwise a single diode for each range would be acceptable.

Figure 1:
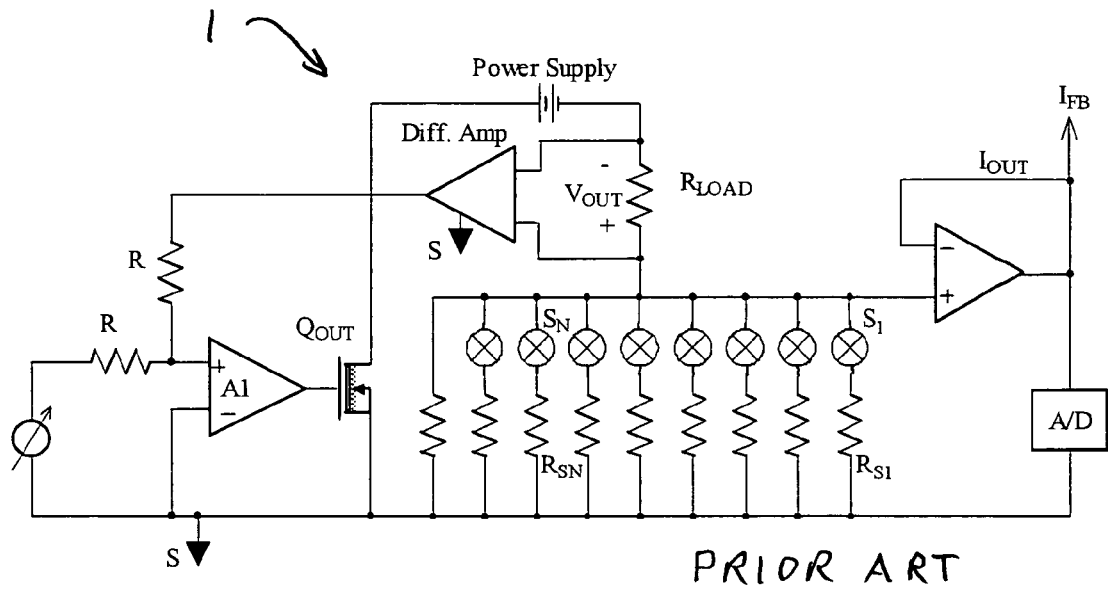
FIG. 1 is a schematic diagram of a prior art device.
Figure 3:
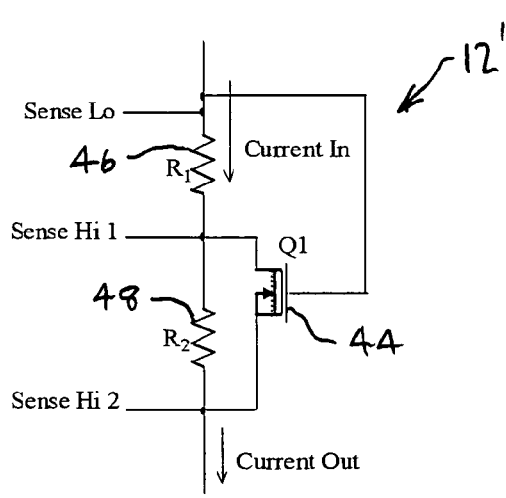
FIG. 3 is a schematic diagram of another exemplary device according to the invention.

Referring to FIG. 3, another range-changing circuit 12' substitutes a mosfet 44 for a zener diode. The current flows through both resistors 46, 48 until the voltage across them reach the threshold voltage of the mosfet 44. At that time, the mosfet 44 starts carry current in parallel with the impedance 48. If the current is increased, the voltage drop across the impedance 46 will also increase which will cause the mosfet 44 to increase its conduction such as to reduce the voltage across the impedance 48. The result is the total voltage across the combination of the impedances 46, 48 only increases a fraction of the amount that the increase of current generates across the impedance 46.

Figure 4:
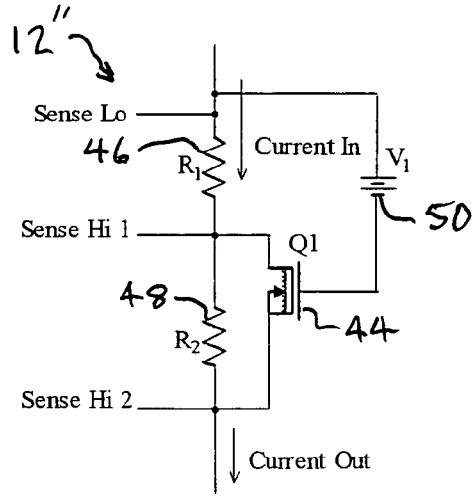
FIG. 4 is a schematic diagram of an additional exemplary device according to the invention.

Referring to FIG. 4, another range-changing circuit 12" adds a bias voltage source 50 to control the threshold voltage of the mosfet 44.

Figure 5:
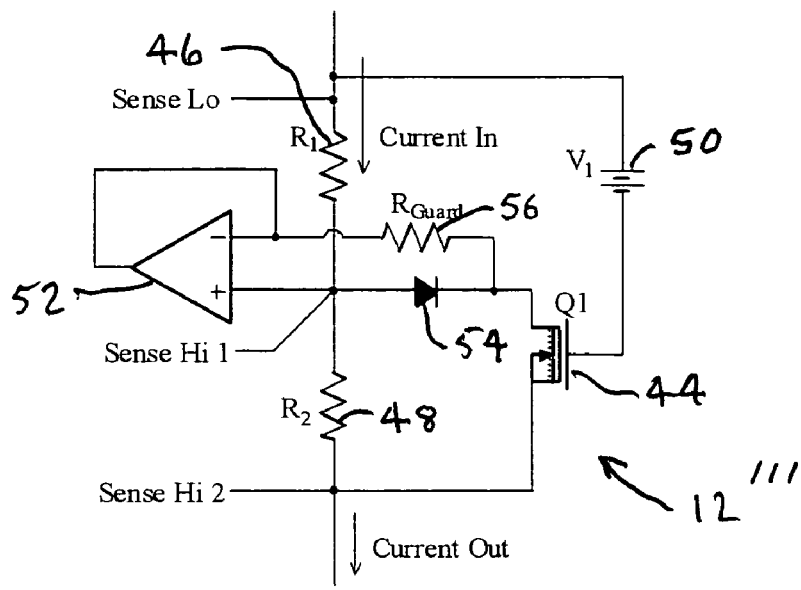
FIG. 5 is a schematic diagram of a further exemplary device according to the invention.

Referring to FIG. 5, another range-changing circuit 12''' adds an amplifier 52, a diode 54 and a guard impedance 56. The three additional components act as a guard, preventing leakage from the mosfet being measured in the case of very low current measurements.

Figure 6:
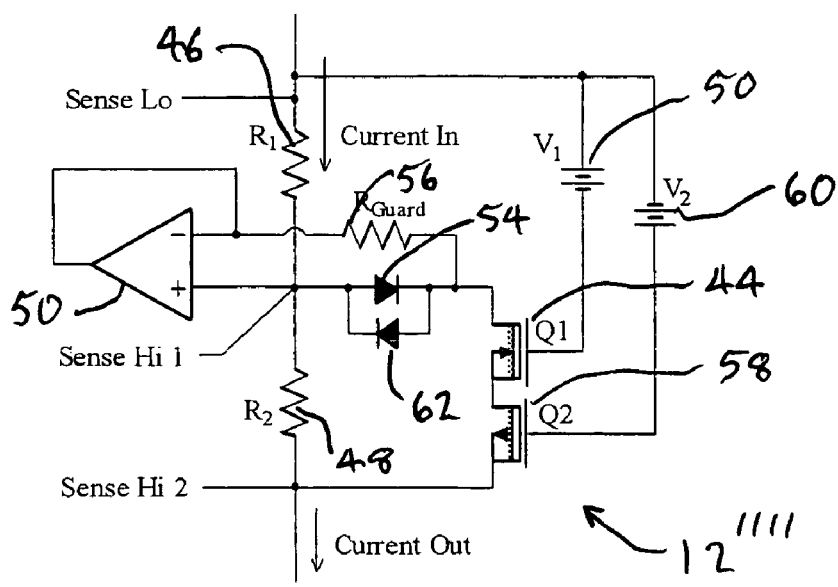
FIG. 6 is a schematic diagram of another further exemplary device according to the invention.

Referring to FIG. 6, another range-changing circuit 12'''' adds a back-to-back mosfet 58 along with an associated bias voltage source 60 and a diode 62 to make the operation of the circuit 12'''' bipolar.

The range-changing circuit of the invention changed ranges "automatically" without needing commands from a controller. One or more of the graduated impedances effectively has a voltage-sensitive switch across it that senses the voltage and limits the voltage drop for that range impedance. This simplifies and miniaturizes the circuitry. In addition, range switching is smoother and more reliable.

In the case of forcing current, it may be desirable to provide range impedance shorting to disable higher value sense elements to remove them from the array.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A range-changing circuit for a measurement device having a desirable range, said circuit comprising:
    an array of graduated impedances in serial relationship; and
    a voltage sensing and limiting switch across one of said impedances, wherein said switch limits the voltage across said one of said impedances in response to a voltage sensed by said switch and thereby provides a voltage in said desirable range across another of said impedance.

2. A circuit according to claim 1, wherein said switch includes a zener diode.

3. A circuit according to claim 1, wherein said switch includes a mosfet.

4. A circuit according to claim 3, wherein the channel of said mosfet is in series with a bias voltage, said bias voltage determining said voltage limit.

5. A circuit according to claim 1, wherein said switch includes a back-to-back pair of zener diode.

6. A circuit according to claim 1, wherein said switch includes a back-to-back pair of mosfets.

7. A circuit according to claim 1, wherein said switch is guarded.

* * * * *